(12) United States Patent
Bae et al.

(10) Patent No.: US 7,391,157 B2
(45) Date of Patent: Jun. 24, 2008

(54) PLASMA DISPLAY DEVICE

(75) Inventors: Sung-Won Bae, Suwon-si (KR); Myoung-Kon Kim, Suwon-si (KR); Tae-Kyoung Kang, Suwon-si (KR); Ki-Jung Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 558 days.

(21) Appl. No.: 10/963,619

(22) Filed: Oct. 14, 2004

(65) Prior Publication Data

US 2005/0088097 A1    Apr. 28, 2005

(30) Foreign Application Priority Data

Oct. 24, 2003    (KR) .................... 10-2003-0074635

(51) Int. Cl.
 *H01J 17/49* (2006.01)
(52) U.S. Cl. ................. 313/587; 313/582; 313/586; 361/680; 361/681
(58) Field of Classification Search ............ 313/46, 313/582–587; 361/680–682, 688, 690, 696, 361/697, 712, 704–709
See application file for complete search history.

(56) References Cited

U.S. PATENT DOCUMENTS

| 5,541,618 | A | | 7/1996 | Shinoda |
| 5,661,500 | A | | 8/1997 | Shinoda et al. |
| 5,663,741 | A | | 9/1997 | Kanazawa |
| 5,674,553 | A | | 10/1997 | Sinoda et al. |
| 5,724,054 | A | | 3/1998 | Shinoda |
| 5,786,794 | A | | 7/1998 | Kishi et al. |
| 5,952,782 | A | | 9/1999 | Nanto |
| 5,971,566 | A | * | 10/1999 | Tani et al. .................... 362/294 |
| RE37,444 | E | | 11/2001 | Kanazawa |
| 6,346,334 | B1 | * | 2/2002 | Kamitani ..................... 428/521 |
| 6,630,916 | B1 | | 10/2003 | Shinoda |
| 6,707,436 | B2 | | 3/2004 | Setoguchi et al. |
| 7,157,838 | B2 | * | 1/2007 | Thielemans et al. ........... 313/35 |
| 2003/0102789 | A1 | | 6/2003 | Kim et al. |

FOREIGN PATENT DOCUMENTS

CN    1174395    2/1998

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Joseph L. Williams
*Assistant Examiner*—Hana A Sanei
(74) *Attorney, Agent, or Firm*—Robert E. Bushnell, Esq.

(57) ABSTRACT

A plasma display device includes: a plasma display panel; a chassis base supporting the plasma display panel, the chassis base being parallel to the plasma display panel; a thermally conductive layer arranged between the plasma display panel and the chassis base, the thermally conductive layer being adjacent to the plasma display panel; and a thermally non-conductive layer arranged between the thermally conductive layer and the chassis base.

17 Claims, 3 Drawing Sheets

FOREIGN PATENT DOCUMENTS

| | | |
|---|---|---|
| CN | 1423297 | 6/2003 |
| JP | 02-148645 | 6/1990 |
| JP | 2845183 | 10/1998 |
| JP | 11-109879 | 4/1999 |
| JP | 2917279 | 4/1999 |
| JP | 2000-040474 | 2/2000 |
| JP | 2001-022281 | 1/2001 |
| JP | 2001-043804 | 2/2001 |
| JP | 2001-325888 | 11/2001 |
| JP | 2002-156913 | 5/2002 |
| JP | 2002-202729 | 7/2002 |
| JP | 2003-131586 | 5/2003 |
| KR | 10-1998-0011613 | 4/1998 |

\* cited by examiner

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on 24 Oct. 2003 and there duly assigned Serial No. 2003-74635.

BACKGROUND OF THE INVENTION

1. Field of the Invention

The present invention relates to a plasma display device, and more particularly, to a plasma display device with a structure in which the heat generated from a plasma display panel is effectively dissipated.

2. Description of the Related Art

A plasma display device uses a discharge gas to display an image and heat is generated by the plasma display panel when an image is displayed. Furthermore, if the amount of electrical discharge of the plasma display device is increased to improve the brightness under the same conditions, the heat generated by the plasma display panel is further increased. Accordingly, it is important to effectively dissipate the heat for the plasma display panel to work smoothly.

In an effort to dissipate the heat, a plasma display panel of a plasma display device is affixed to a chassis base having a high thermal conductivity. In addition, a heat discharge sheet or a thermal conduction sheet is interposed between the plasma display panel and the chassis base so that the heat generated by the plasma display panel can be conducted and dissipated from the device to the heat discharge sheet and the chassis base. The chassis base is generally made of metal, such as aluminum, and is manufactured by a die casting process. The heat discharge sheet is made of silicone resin, acrylic resin, etc.

The heat discharge sheet developed for plasma display devices including the above mentioned technology, has a structure such that the heat from the plasma display panel is transferred toward the thickness direction to dissipate the heat from the device through the chassis base. That is, the heat discharge sheet of the plasma display device has a role in transferring the heat in a one dimensional direction along the thickness direction to dissipate the heat. Accordingly, it is an important technical issue to prevent the decrease in the heat discharge efficiency due to an air layer of low thermal conductivity by tightly contacting the heat discharge sheet between the panel and the chassis base.

The heat discharge sheet is substantially effective considering that the plasma display panel has a thin structure. However, as the plasma display panel increases in size in accordance with the technology developments and the customers' needs, and as the heat generated by the plasma display panel is transferred in a direction perpendicular to the thickness direction i.e. the plane direction of the heat discharge sheet as well as the thickness direction of the heat discharge sheet, the heat discharge sheet has a problem in that the heat discharge efficiency is lowered.

In addition, the heat dissipation of the plasma display panel is based on the assumption that the heat generation by the panel is large. However, as the efficiency of the panel increases, the heat generated by the panel is decreased and accordingly, the heat generated by the circuit unit is relatively increased so that some of the heat generated by the circuit unit can be transferred to the panel. Under such circumstances, it is necessary to protect the panel from the heat generated by the circuit. However, the usual heat discharge methods cannot eliminate the heat transfer from the circuit unit to the panel.

SUMMARY OF THE INVENTION

One aspect of the present invention is to provide a plasma display device which facilitates the transfer of heat generated by a plasma display panel to efficiently dissipate the heat.

In addition, a plasma display device is provided in which the heat generated by the circuit unit is prevented from being transferred to the panel.

A plasma display device according to an embodiment of the present invention includes: a plasma display panel; a chassis base supporting the plasma display panel, the chassis base being parallel to the plasma display panel; a thermally conductive layer arranged between the plasma display panel and the chassis base, the thermally conductive layer being adjacent to the plasma display panel; and a thermally non-conductive layer arranged between the thermally conductive layer and the chassis base.

The thickness of the thermally conductive layer is preferably different from that of the thermally non-conductive layer.

The thickness of the thermally conductive layer is preferably equal to or greater than 0.5 mm.

The thickness of the thermally conductive layer is preferably between 0.5 mm and 2.0 mm.

The thickness of the thermally non-conductive layer is preferably less than or equal to 1.0 mm.

The thickness of the thermally non-conductive layer is preferably between 0.1 mm and 0.3 mm.

The thermal conductivity of the thermally conductive layer is preferably between 0.1 W/mK and 1000 W/mK.

The thermal conductivity of the thermally non-conductive layer is preferably less than or equal to 0.1 W/mK.

The thermally conductive layer is preferably affixed to the plasma display panel with an acrylic adhesive.

The thermally conductive layer and the thermally non-conductive layer preferably tightly contact each other.

The thermally non-conductive layer preferably has a solid layer.

The thermally non-conductive layer preferably has a liquid or gel phase layer.

The thermally non-conductive layer preferably has a gas layer.

A plasma display device according to another embodiment of the present invention includes: a plasma display panel; a chassis base supporting the plasma display panel, the chassis base being parallel to the plasma display panel; a thermal conduction member arranged between the plasma display panel and the chassis base and being adjacent to the plasma display panel; and an air layer arranged between the thermal conduction member and the chassis base.

The thermal conductivity of the thermal conduction member is preferably between 0.1 W/mK and 1000 W/mK.

The thermal conductivity of the air layer is preferably less than or equal to 0.1 W/mK.

The thermal conduction member preferably comprises a single or composite material selected from the group consisting of metal, silicon, acryl, carbon, graphite, carbon nanotubes, and fluorine.

The thermal conduction member is preferably affixed to the plasma display panel with an adhesive.

The air layer is preferably arranged on the entire surface where the thermal conduction member opposes the chassis base.

The plasma display panel and the chassis base are preferably affixed together by an adhering member interposed therebetween, and the thickness of the adhering member is preferably greater than that of the thermal conduction member.

The thickness of the air layer is preferably between 0.1 mm and 0.3 mm.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Exemplary embodiments of the present invention will now be described in detail with reference to the accompanying drawings.

Figure 1:
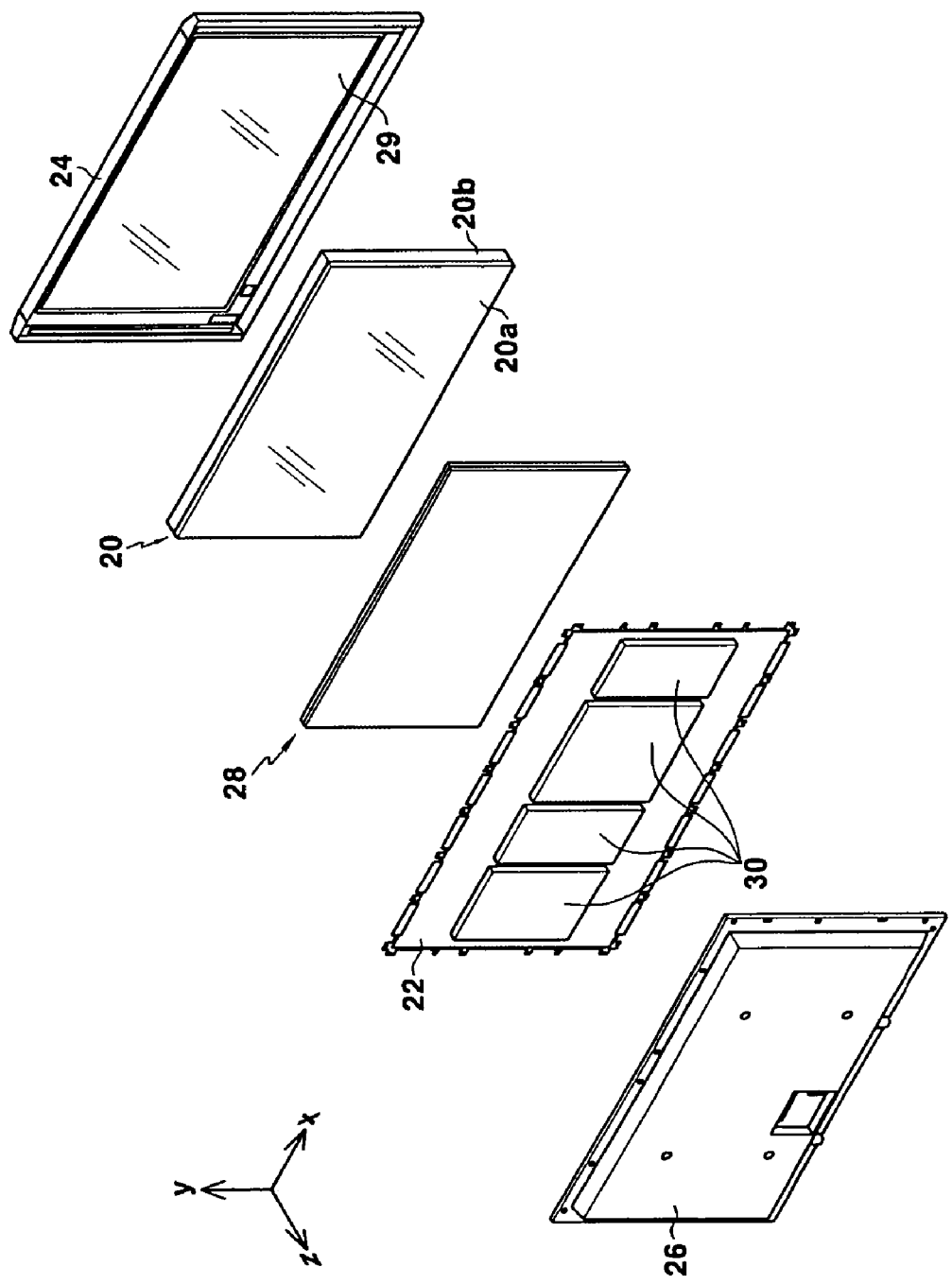
FIG. 1 is a schematic exploded perspective view of a plasma display device according to one embodiment of the present invention.

FIG. 1 is a schematic exploded perspective view of a plasma display device according to one embodiment of the present invention.

As shown in FIG. 1, the plasma display device includes a plasma display panel 20 having two glass substrates 20a and 20b adapted to form and display an image, a chassis base 22, arranged on one side of the plasma display panel 20, i.e. the side opposite to an image displaying side, and combined with the plasma display panel 20, a front case 24 arranged on the front side of the plasma display panel 20, and a back case 26 arranged on the back side of the chassis base 22.

The plasma display device has a thermally diffusive sheet member 28 arranged between the plasma display panel 20 and the chassis base 22 to diffuse the heat generated by the plasma display panel 20, and a filter 29 arranged on the front case 24 to shield electromagnetic interference emitted by the plasma display panel 20.

Generally, the plasma display panel 20 has a rectangular shape with a width that is greater than its height for the exemplarily embodiment. The chassis base 22 has a shape corresponding to the plasma display panel 20, and is made of high thermally conductive materials, such as aluminum. A plurality of driving circuit boards 30 for driving the plasma display panel 20 are arranged on one side of the chassis base 22 opposing the other side where the plasma display panel 20 is affixed.

The thermally diffusive member 28 of the present invention has at least two layers to contact the chassis base 22 as well as the plasma display panel 20, and they also contact each other.

Figure 2:
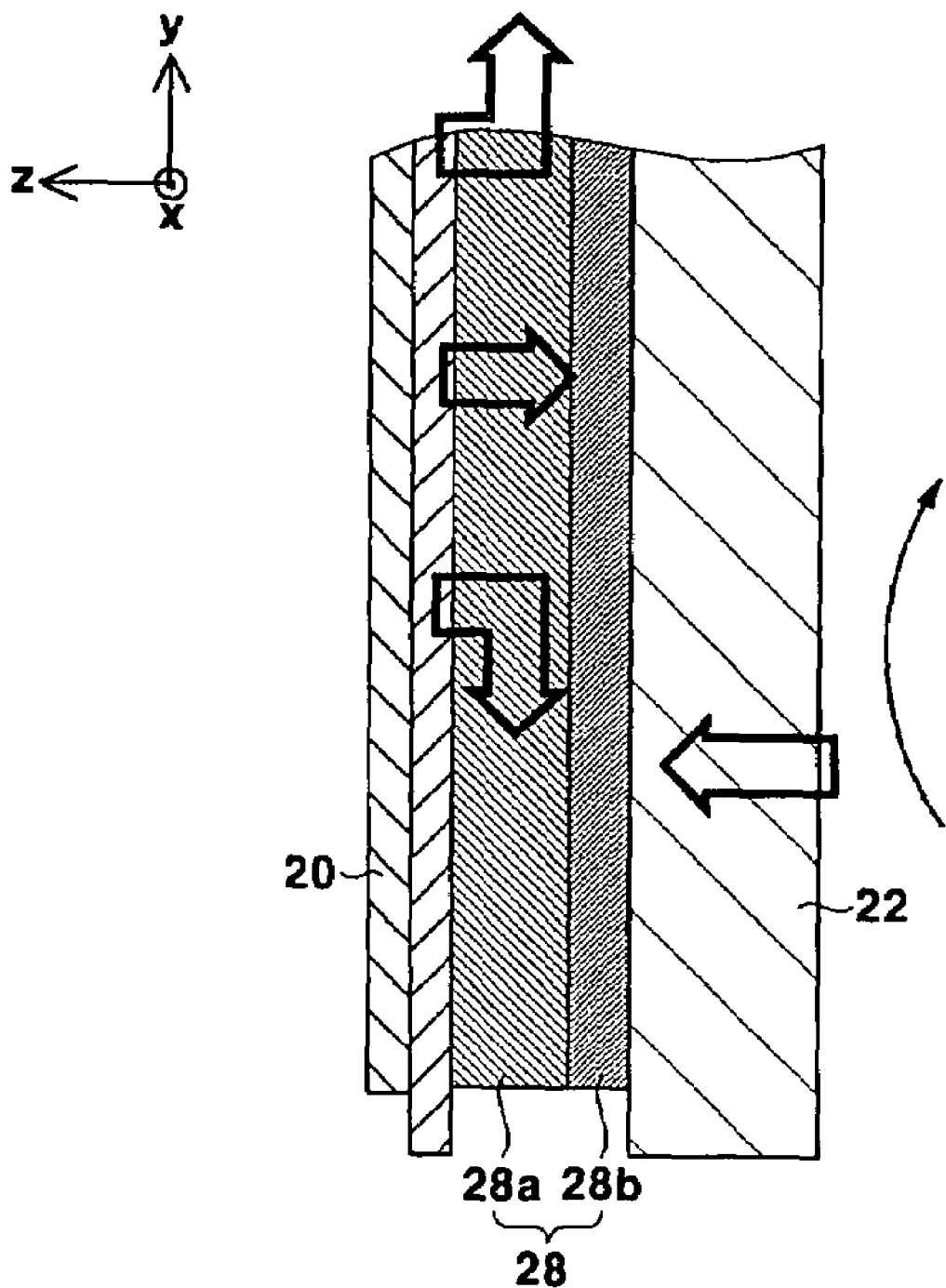
FIG. 2 is a schematic partial cross-sectional view of a structure of a thermally conductive layer and a thermally non-conductive layer of a plasma display device according to one embodiment of the present invention.

That is, as shown in FIG. 2, a thermally conductive layer 28a with a predetermined thickness is arranged on one side of the plasma display panel 20 with surface contact, and a thermally non-conductive layer 28b that is thinner than the thermally conductive layer 28a is arranged on one end of the chassis base with surface contact. The thermally conductive layer 28a and the thermally non-conductive layer 28b tightly contact each other with facing sides.

The thermally conductive layer 28a and the thermally non-conductive layer 28b of the exemplarily embodiment of the present invention can be formed with the following characteristics.

The thermally conductive layer 28a has a thickness that is equal to or greater than 0.5 mm, preferably between 0.5 mm and 2.0 mm, and its phase can be a solid, liquid or gel phase.

If the thermally conductive layer 28a is in a solid phase, it can be formed with a single or composite material of metal, silicone, acryl, carbon, graphite, carbon nanotubes, and fluorine. The thermal conductivity of the thermally conductive layer 28a is maintained between 0.1 W/mK and 1000 W/mK.

The thermally non-conductive layer 28b is formed to have a thickness that is less than that of the thermally conductive layer 28a, for example, less than or equal to 1.0 mm and is preferably between 0.1 mm and 0.3 mm. In addition, the thermally non-conductive layer 28b has a lower thermal conductivity than that of the thermally conductive layer 28a and is maintained less than or equal to 0.1 W/mK.

The phase of the thermally non-conductive layer 28b can be a solid, liquid, or gel phase. For a solid phase, a polymer resin or ceramic material can be used. The plasma display device, having the thermally diffusive member 28 noted above, conducts the heat generated by the plasma display panel 20 toward the chassis base 22 through the thermally conductive layer 28a. Heat resistance caused by natural convection (see the arrow direction) and additional heat resistance caused by the thermally non-conductive layer 28b occur from the chassis base 22 to the thermally conductive layer 28a. Accordingly, the heat produced by the plasma display panel 20 is conducted toward the plane direction (see the arrow direction, x-y plane direction in FIG. 2) rather than the thickness direction (z-axis direction in FIG. 2) of the thermally conductive layer 28a.

Such effects can be achieved by disposing the thermally non-conductive layer 28b having a lower thermal conductivity than that of the thermally conductive layer 28a (the thermal conductivity being that of an insulating material) to face the thermally conductive layer 28a. Since the thermally conductive layer 28a is thicker than the thermally non-conductive layer 28b, the effects can be achieved more efficiently.

Heat is generated not only by the plasma display panel 20 as described above but also II by the driving circuit board 30 mounted on the chassis base 22.

The heat generated by the driving circuit board 30 is transferred to the back case 26 to dissipate from the device through a vent hole formed on the back case 26. However, some of the heat is conducted to the chassis base 22 to move toward to the plasma display panel 20.

However, in the present invention, the thermally non-conductive layer 28b adjacent to the chassis base 22 reduces the heat transfer toward the plasma display panel 20, such that the heat generated by the driving circuit board 30 is not transferred to the plasma display panel 20 and rather is induced toward the back case 26 by natural convection to increase the amount of heat dissipated from the device.

The thermally diffusive member 28 enables the plasma display device according to the present invention to effectively diffuse the heat from the plasma display panel 20 or from the driving circuit board 30.

Figure 3:
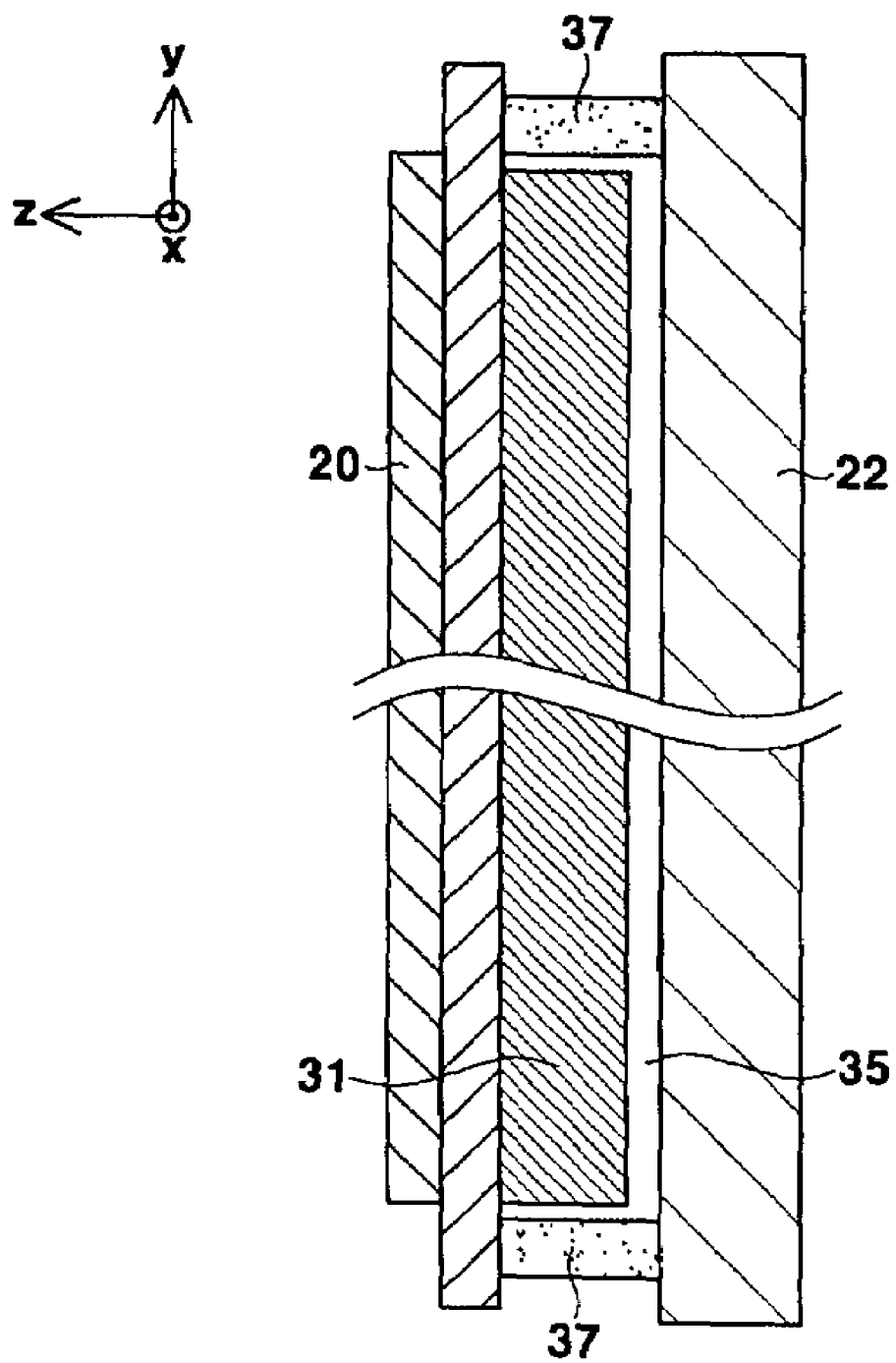
FIG. 3 is a schematic partial cross-sectional view of a plasma display device according to another embodiment of the present invention.

FIG. 3 is a schematic partial cross-sectional view of a plasma display device according to another embodiment of the present invention.

As shown in FIG. 3, a plasma display device according another embodiment of the present invention includes a plasma display panel 20 adapted to display an image, a chassis base 22 supporting the plasma display panel 20 and arranged to be parallel thereto, and a thermal conduction member 31 interposed between the plasma display panel 20 and the chassis base 22. The thermal conduction member 31 is arranged to be adjacent to the plasma display panel 20 and to be spaced apart from the chassis base 22. Accordingly, an air layer 35 is formed between the thermal conduction member 31 and the chassis base 22. It is preferable that the air layer 35 is formed on the entire surface where the thermal conduction member 31 opposes the chassis base 22.

The thermal conduction member 31 can be formed with materials in a solid, liquid or gel phase. When using a solid material, the thermal conduction member 31 can be formed with a single or composite material of metal, silicon, acryl, carbon, graphite, carbon nanotubes, and fluorine, or a thin metal film can be used by tightly contacting it on the plasma display panel 20. When using a material in a liquid or gel phase, a metallic filler can be used together in the thermal conduction member 31 to increase the thermal conductivity.

The thermal conductivity of the thermal conduction member 31 is between 0.1 W/mK and 1000 W/mK, and the thermal conductivity of the air layer 35 is preferably less than or equal to 0.1 W/mK.

Furthermore, the plasma display panel 20 and the chassis base 22 can be affixed to each other by interposing a double coated tape 37 between the plasma display panel 20 and the chassis base 22. The thickness of the double coated tape 37 in the direction of panel thickness (z-axis direction of FIG. 3) is thicker than that of the thermal conduction member 31 to form the air layer between the chassis base 22 and the thermal conduction member 31.

Although the present invention has been described in detail hereinabove in connection with certain exemplary embodiments, it should be understood that the present invention is not limited to the disclosed exemplary embodiments, but, on the contrary, is intended to cover various modifications and/or equivalent arrangements included within the spirit and scope of the present invention, as recited in the appended claims.

The plasma display device according to the present invention has a thermally diffusive member with the thermally conductive layer and the thermally non-conductive layer interposed between the plasma display panel and the chassis base, and the heat generated by the heat source, such as the panel, is diffused toward the plane direction of the panel to improve the heat dissipation efficiency. In addition, the present invention can avoid the transfer of heat generated by the driving circuit board to the panel, and thereby prevent the influence of the heat generated from outside of the panel to the panel.

Furthermore, the present invention can prevent the heat concentration of the panel by making the thermal conductivity in the plane direction better than the thermal conductivity in the thickness direction so that the heat distribution can be uniform over the whole panel, and it can also prevent the image sticking phenomenon, i.e. the phenomenon in which a brightness difference partially occurs between the area where the brighter patterns have been formed and the area therearound, if the same patterns are uniformly displayed overall after the brighter patterns have been partially displayed for some time.

What is claimed is:

1. A plasma display device, comprising:
    a plasma display panel;
    a chassis base mechanically supporting the plasma display panel, the chassis base being parallel to the plasma display panel;
    a thermally conductive layer arranged between the plasma display panel and the chassis base, the thermally conductive layer being adjacent to the plasma display panel; and
    a thermally non-conductive layer arranged between the thermally conductive layer and the chassis base;
    wherein the thermal conductivity of the thermally conductive layer is between 0.1 W/mK and 1000 W/mK; and
    wherein the thermal conductivity of the thermally non-conductive layer is less than or equal to 0.1 W/mK.

2. The plasma display device of claim 1, wherein the thickness of the thermally conductive layer is different from that of the thermally non-conductive layer.

3. The plasma display device of claim 1, wherein the thickness of the thermally conductive layer is equal to or greater than 0.5 mm.

4. The plasma display device of claim 3, wherein the thickness of the thermally conductive layer is between 0.5 mm and 2.0 mm.

5. The plasma display device of claim 1, wherein the thickness of the thermally non-conductive layer is less than or equal to 1.0 mm.

6. The plasma display device of claim 5, wherein the thickness of the thermally non-conductive layer is between 0.1 mm and 0.3 mm.

7. The plasma display device of claim 1, wherein the thermally conductive layer is affixed to the plasma display panel with an acrylic adhesive.

8. The plasma display device of claim 1, wherein the thermally conductive layer and the thermally non-conductive layer tightly contact each other.

9. The plasma display device of claim 1, wherein the thermally non-conductive layer has a solid layer.

10. The plasma display device of claim 1, wherein the thermally non-conductive layer has a liquid or gel phase layer.

11. The plasma display device of claim 1, wherein the thermally non-conductive layer has a gas layer.

12. A plasma display device, comprising:
 a plasma display panel;
 a chassis base mechanically supporting the plasma display panel, the chassis base being parallel to the plasma display panel;
 a thermal conduction member arranged between the plasma display panel and the chassis base and being adjacent to the plasma display panel; and
 an air layer arranged between the thermal conduction member and the chassis base;
 wherein the thermal conductivity of the thermal conduction member is between 0.1 W/mK and 1000 W/mK; and
 wherein the thermal conductivity of the air layer is less than or equal to 0.1 W/mK.

13. The plasma display device of claim 12, wherein the thermal conduction member comprises a single or composite material selected from the group consisting of metal, silicon, acryl, carbon, graphite, carbon nanotubes, and fluorine.

14. The plasma display device of claim 12, wherein the thermal conduction member is affixed to the plasma display panel with an adhesive.

15. The plasma display device of claim 12, wherein the air layer is arranged on the entire surface where the thermal conduction member opposes the chassis base.

16. The plasma display device of claim 12, wherein the plasma display panel and the chassis base are affixed together by an adhering member interposed therebetween, and wherein the thickness of the adhering member is greater than that of the thermal conduction member.

17. The plasma display device of claim 12, wherein the thickness of the air layer is between 0.1 mm and 0.3 mm.

\* \* \* \* \*